(12) United States Patent
Yang

(10) Patent No.: US 12,342,562 B2
(45) Date of Patent: Jun. 24, 2025

(54) HIGH ELECTRON MOBILITY TRANSISTOR AND METHOD FOR FORMING THE SAME USING THE METAL GATE LAYER AND SPACER AS AN ETCH MASK

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/373,291

(22) Filed: Sep. 27, 2023

(65) Prior Publication Data

US 2024/0021703 A1 Jan. 18, 2024

Related U.S. Application Data

(63) Continuation of application No. 17/333,045, filed on May 28, 2021, now Pat. No. 12,176,414.

(30) Foreign Application Priority Data

Mar. 29, 2021 (CN) .......................... 202110344718.2

(51) Int. Cl.
*H10D 30/01* (2025.01)
*H10D 30/47* (2025.01)
*H10D 62/85* (2025.01)

(52) U.S. Cl.
CPC ......... *H10D 30/015* (2025.01); *H10D 30/475* (2025.01); *H10D 62/8503* (2025.01)

(58) Field of Classification Search
CPC ........... H01L 29/66462; H01L 29/2003; H01L 29/7786; H01L 23/3157; H10D 30/015; H10D 30/475; H10D 62/8503; H10D 30/6738; H10D 30/675; H10D 64/64; H10D 62/343; H10D 62/85; H10D 64/01
See application file for complete search history.

(56) References Cited

U.S. PATENT DOCUMENTS

| | | |
|---|---|---|
| 10,229,992 B2 | 3/2019 | Miura |
| 11,563,097 B2 | 1/2023 | Cnang |
| 2012/0175631 A1 | 7/2012 | Lidow |
| 2012/0205717 A1* | 8/2012 | Kurahashi ......... H01L 29/42316 |
| | | 257/E21.403 |
| 2012/0319169 A1 | 12/2012 | Van Hove |

(Continued)

FOREIGN PATENT DOCUMENTS

| | | |
|---|---|---|
| CN | 108735810 A | 11/2018 |
| CN | 109817710 A | 5/2019 |

*Primary Examiner* — William B Partridge
*Assistant Examiner* — David Paul Sedorook
(74) *Attorney, Agent, or Firm* — Winston Hsu

(57) ABSTRACT

A method for forming a high electron mobility transistor includes the steps of providing a substrate, sequentially forming a buffer layer, a channel layer, a barrier layer, and a semiconductor gate layer on the substrate, forming a metal gate layer on the semiconductor gate layer, forming an insulating layer on the barrier layer, the semiconductor gate layer, and the metal gate layer and a passivation layer on the insulating layer, forming an opening through the passivation layer and the insulating layer to expose the metal gate layer, and forming a gate electrode on the passivation layer and filling the opening.

7 Claims, 7 Drawing Sheets

(56) References Cited

U.S. PATENT DOCUMENTS

| | | | |
|---|---|---|---|
| 2014/0042455 A1* | 2/2014 | Chyi | H01L 29/778 |
| | | | 438/172 |
| 2014/0131720 A1 | 5/2014 | Hsiung | |
| 2014/0191240 A1 | 7/2014 | Chiang | |
| 2015/0011069 A1 | 1/2015 | Xu | |
| 2015/0034905 A1 | 2/2015 | Xiao | |
| 2015/0170974 A1 | 6/2015 | Xu | |
| 2016/0276473 A1 | 9/2016 | Edwards | |
| 2017/0194451 A1* | 7/2017 | Hua | H01L 23/291 |
| 2018/0166565 A1 | 6/2018 | Chen | |
| 2018/0261507 A1 | 9/2018 | Jacobi | |
| 2018/0308968 A1* | 10/2018 | Miura | H01L 21/02381 |
| 2018/0337242 A1* | 11/2018 | Yang | H01L 29/66446 |
| 2020/0111876 A1* | 4/2020 | Wang | H01L 29/66462 |
| 2020/0235218 A1 | 7/2020 | Stoffels | |
| 2020/0365699 A1* | 11/2020 | Chang | H01L 29/42316 |
| 2021/0066484 A1 | 3/2021 | Yeh | |
| 2021/0119011 A1 | 4/2021 | Chiu | |
| 2021/0217884 A1 | 7/2021 | Macelwee | |
| 2021/0242324 A1* | 8/2021 | Yao | H01L 29/4991 |
| 2022/0223694 A1 | 7/2022 | Kantarovsky | |
| 2022/0336649 A1* | 10/2022 | Lin | H01L 29/432 |
| 2022/0376082 A1 | 11/2022 | Zhang | |

\* cited by examiner

HIGH ELECTRON MOBILITY TRANSISTOR AND METHOD FOR FORMING THE SAME USING THE METAL GATE LAYER AND SPACER AS AN ETCH MASK

CROSS REFERENCE TO RELATED APPLICATIONS

This application is a continuation application of U.S. application Ser. No. 17/333,045, filed on May 28, 2021. The content of the application is incorporated herein by reference.

BACKGROUND OF THE INVENTION

1. Field of the Invention

The present invention relates to semiconductor technology, and more particularly relates to a high electron mobility transistor (HEMT) and method for forming the same.

2. Description of the Prior Art

A high electron mobility transistor (HEMT) is a new type of field effect transistor which usually includes a heterostructure including stacked semiconductor layers. By bonding semiconductor layers having different band gaps, the energy band near the heterojunction between the semiconductor layers may bend to form a potential well. The free electrons may converge to the potential well thereby forming a two-dimensional electron gas (2DEG) layer near the heterojunction. The two-dimensional electron gas layer may be utilized as a current channel region of the high electron mobility transistor. Among the group III-V compound semiconductors, gallium nitride (GaN) based compounds have drawn a lot of attention for having wide band gaps, high breakdown voltages, high bonding strengths, and high thermal stabilities. The unique spontaneous polarization and piezoelectric polarization properties of the GaN based compounds may form two-dimensional electron gas layers with high electron concentration and high electron mobility, so that an improved witching speed and response frequency may be obtained. GaN based high electron mobility transistors have gradually replaced the silicon based transistors in technical fields such as power converters, low noise amplifiers, radio frequency (RF) or millimeter wave (MMW).

Currently, a GaN based enhancement mode high electron mobility transistor usually includes a heterostructure including stacked layers of p-type GaN/AlGaN/GaN. The p-type GaN layer is used as a semiconductor gate layer and is electrically connected to a gate electrode disposed thereon for controlling the turn-on and turn-off of the channel. When no bias voltage is applied, the built-in voltage of the p-GaN layer may pull up the energy band between the AlGaN layer and the GaN layer, so that the two-dimensional electron gas layer near the heterojunction between the AlGaN layer and the GaN layer may be depleted and a normally-off operation of the high electron mobility transistor may be provided. However, the existing GaN based enhancement mode high electron mobility transistors still have some problems need to be solved. For example, during operation, the electric field in the p-GaN gate layer caused by the voltage of the gate electrode may produce a parasitic transistor on the sidewall of the p-GaN layer and cause gate leakage, and unfavorably result in degradation of device performance and reliability.

SUMMARY OF THE INVENTION

In light of the above, the present invention is directed to provide a high electron mobility transistor (HEMT) and a method for forming the same. Particularly, the HEMT provided by the present invention forms a metal gate layer between the semiconductor gate layer and the gate electrode and makes the sidewall of the metal gate layer retracted away from the sidewall of the semiconductor gate layer. In this way, when the high electron mobility transistor is in operation, the strength of the electric field near the sidewall of the semiconductor gate layer may be reduced, so that the gate leakage caused by the parasitic transistor on the sidewall of the semiconductor gate layer may be reduced.

According to one embodiment of the present invention, a method for forming a high electron mobility transistor is disclosed, which includes the steps of providing a substrate; forming a buffer layer on the substrate, a channel layer on the buffer layer, a barrier layer on the channel layer, and a semiconductor gate layer on the barrier layer; forming a metal gate layer on the semiconductor gate layer; forming a spacer on a sidewall of the metal gate layer; using the metal gate layer and the spacer as a mask to etch the semiconductor gate layer; forming a passivation layer covering the barrier layer, the semiconductor gate layer, and the metal gate layer; forming an opening in the passivation layer to expose the metal gate layer; and forming a gate electrode on the passivation layer and in direct contact with the metal gate layer.

According to another embodiment of the present invention, a method for forming a high electron mobility transistor is disclosed, which includes the steps of providing a substrate; forming a buffer layer on the substrate, a channel layer on the buffer layer, a barrier layer on the channel layer, and a semiconductor gate layer on the barrier layer; forming a metal gate layer on the semiconductor gate layer and a dummy gate on the metal gate layer; forming a spacer on a sidewall of the metal gate layer and a sidewall of the dummy gate; using the dummy gate and the spacer as a mask to etch the semiconductor gate layer; forming a passivation layer covering the barrier layer, the semiconductor gate layer, and the dummy gate; forming an opening in the passivation layer to expose the dummy gate; removing the dummy gate to expose the metal gate layer; and forming a gate electrode on the passivation layer and in direct contact with the metal gate layer.

According to still another embodiment of the present invention, a high electron mobility transistor is disclosed, which includes a substrate, a buffer layer on the substrate, a channel layer on the buffer layer, a barrier layer on the channel layer, a semiconductor gate layer on the barrier layer, a metal gate layer on the semiconductor gate layer, and a gate electrode on the metal gate layer, wherein a portion of the semiconductor gate layer at two sides of the metal gate layer comprises a recessed top surface.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
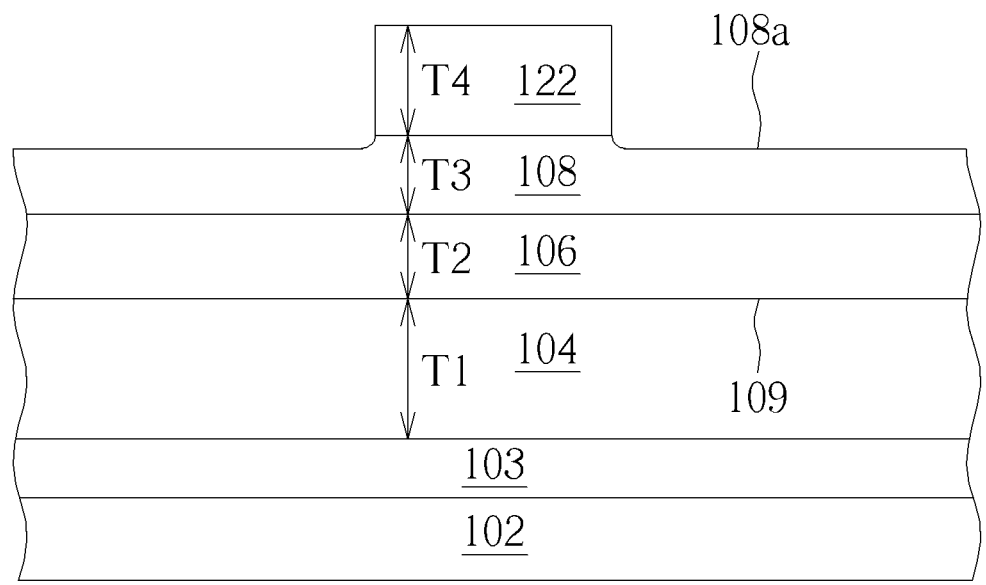
FIG. 1 to FIG. 5 are schematic cross-sectional views of a high electron mobility transistor at different steps of a manufacturing process according to a first embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 to FIG. 5 are schematic cross-sectional views of a high electron mobility transistor (HEMT) at different steps of a manufacturing process according to a first embodiment of the present invention. Please refer to FIG. 1, a substrate 102 is provided, and an epitaxial stacked layer is formed on the substrate 102. The epitaxial stacked layer may include, form the bottom (near the substrate 102) to the top (away from the substrate 102), a buffer layer 103, a channel layer 104, a barrier layer 106, and a semiconductor gate layer 108. Subsequently, a metal gate layer 122 is formed on the semiconductor gate layer 108. According to an embodiment of the present invention, the buffer layer 103, the channel layer 104, the barrier layer 106, and the semiconductor gate layer 108 may be formed by performing a heteroepitaxy growth process, such as a molecule beam epitaxy (MBE) process, a metal-organic chemical vapor deposition (MOCVD) process, or a hydride vapor phase deposition (HVPE) process, but is not limited thereto.

The material of the substrate 102 may include silicon, silicon carbide (SiC), sapphire, gallium nitride (GaN), aluminum nitride (AlN), or other suitable materials, but is not limited thereto. The buffer layer 103, the channel layer 104, the barrier layer 106, and the semiconductor gate layer 108 may respectively include a group III-V compound semiconductor material, such as gallium nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but is not limited thereto. According to an embodiment of the present invention, the material of the buffer layer 103 may include aluminum nitride (AlGaN), the material of the channel layer 104 may include gallium nitride (GaN), and the material of the barrier layer 106 may include aluminum gallium nitride (AlGaN). A two-dimensional electron gas layer (not shown) may be formed near the junction 109 between the barrier layer 106 and the channel layer 104, which may serve as a planar-type current channel when the high electron mobility transistor is at on-state.

The material of the semiconductor gate layer 108 may include an n-type (negative conductive type) or a p-type (positive conductive type) semiconductor material, using its intrinsic built-in voltage to pull up the energy band and deplete the two-dimensional electron gas layer between the barrier layer 106 and the channel layer 104 directly under the semiconductor gate layer 108, so that a normally-off operation may be provided. According to an embodiment of the present invention, the semiconductor gate layer 108 may include p-type gallium nitride (p-GaN) having dopants such as magnesium (Mg), iron (Fe) or other suitable p-type dopants.

The thicknesses of the channel layer 104, the barrier layer 106, and the semiconductor gate layer 108 may be designed to adjust the electron density and mobility of the two-dimensional electron gas layer for a desired performance. According to an embodiment of the present invention, the channel layer 104 may have a thickness T1 between 5 nm and 400 nm, the barrier layer 106 may have a thickness T2 between 10 nm and 14 nm and the semiconductor gate layer 108 may have a thickness T3 between 70 nm and 90 nm, but are not limited thereto.

According to an embodiment of the present invention, the metal gate layer 122 may be formed by forming a conductive layer (not shown) on the semiconductor gate layer 108 through a chemical vapor deposition (CVD) process, a physical vapor deposition (PVD) process, or atomic layer deposition (ALD) process, and then performing a patterning process (such as a photolithography-etching process) to the conductive layer to form the metal gate layer 122. As shown in FIG. 1, the metal gate layer 122 may have a thickness T4.

It is noteworthy that, during the patterning process of the conductive layer, the portions of the semiconductor gate layer 108 exposed from the metal gate layer 122 may be etched and loses some thickness to ensure the conductive layer being completely patterned. Therefore, the portions of the semiconductor gate layer 108 at two sides of the metal gate layer 122 may respectively have a recessed top surface 108a that is slightly lower than a bottom surface of the metal gate layer 122 and may have a concave or curved cross-sectional profile. In other words, the top surface of the semiconductor gate layer 108 covered by the metal gate layer 122 and the top surfaces of the semiconductor gate layer 108 exposed from the metal gate layer 122 are not co-planar.

The material of the metal gate layer 122 may include metal, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. According to an embodiment of the present invention, the material of the metal gate layer 122 may include titanium nitride (TiN). The interface between the semiconductor gate layer 108 and the metal gate layer 122 is a metal-semiconductor contact, and preferably a Schottky contact having a rectification function. According to an embodiment of the present invention, a hard mask layer (not shown) such as a silicon nitride (SiN) layer may be disposed on the metal gate layer 122.

Figure 2:
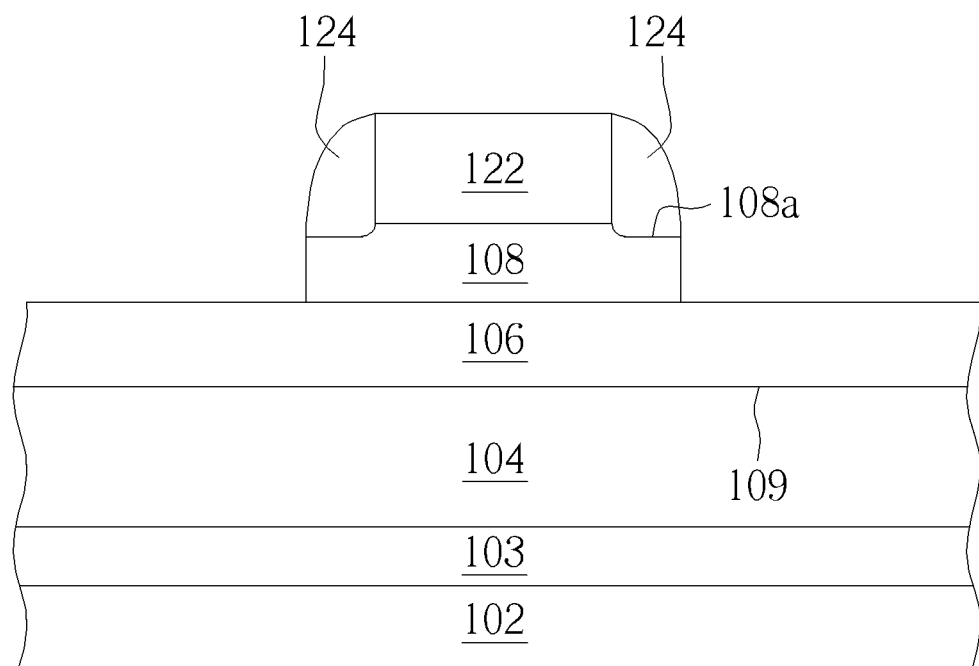

Please refer to FIG. 2. Following, spacers 124 are formed on the sidewalls of the metal gate layer 122. An etching process is then performed, using the metal gate layer 122 and the spacers 124 as a mask to etch and pattern the semiconductor gate layer 108 until the barrier layer 106 is exposed from the patterned semiconductor gate layer 108. According to an embodiment of the present invention, the spacers 124 may be formed by the self-aligned spacer process well-known in the field. For example, a spacer material layer (not shown) may be formed in a blanket manner and conformally covering the surface of the semiconductor gate layer 108 and the sidewall and top surface of the metal gate layer 122. Afterward, an anisotropic etching process may be performed to etch and remove the spacer material on the surface of the semiconductor gate layer 108 and the top surface of the metal gate layer 122 while leaving portions of the semiconductor gate layer 108 on the sidewalls of the metal gate layer 122 as the spacers 124. It is noteworthy that the thickness T4 of the metal gate layer 122 needs to be large enough to provide a sidewall with a height sufficient for performing the self-aligned spacer process while not increasing the gate resistance too much. According to an embodiment of the present invention, preferably, the thickness T4 of the metal gate layer 122 may be approximately 1 to 1.5 times of the thickness T3 of the semiconductor gate layer 108. According to an embodiment of the present invention, the thickness T3 of the semiconductor gate layer 108 may be between 70 nm and 90 nm, and the thickness T4 of the metal gate layer 122 may be between 120 nm and 140 nm, but are not limited thereto.

Figure 3:
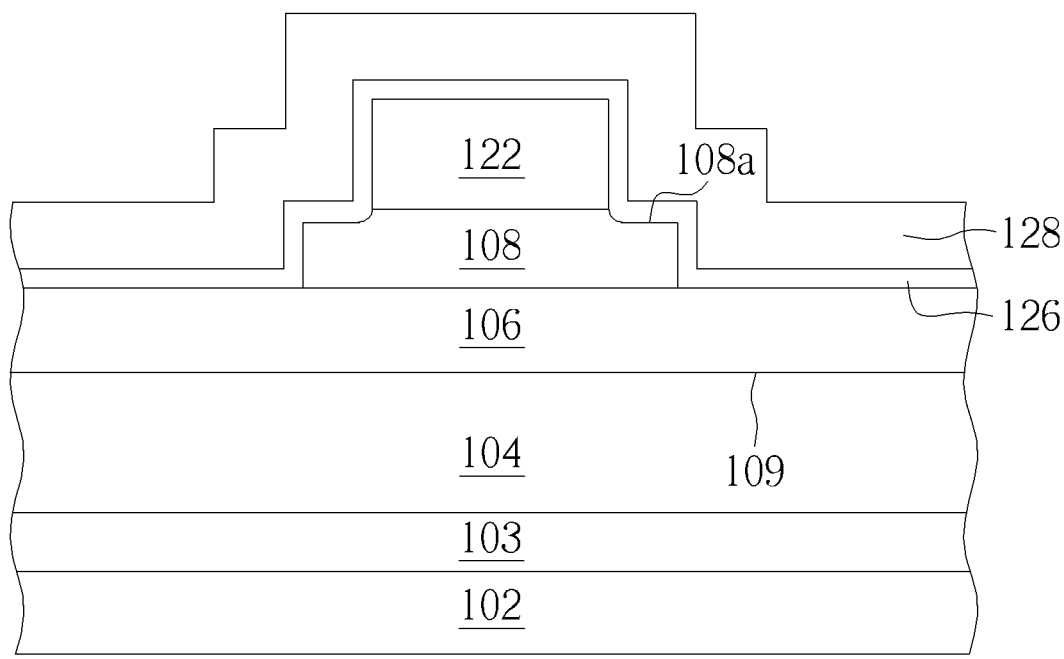

Please refer to FIG. 3. Subsequently, the spacers 124 are removed, and an insulating layer 126 and a passivation layer 128 are formed in a blanket manner to cover the surface of the barrier layer 106, the sidewall and recessed top surface 108a of the semiconductor gate layer 108, and the sidewall and top surface of the metal gate layer 122. The insulating layer 126 and the passivation layer 128 may respectively include a dielectric material, such as aluminum nitride (AlN), aluminum oxide ($Al_2O_3$), boron nitride (BN), silicon nitride ($Si_3N_4$), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof, but is not limited thereto. By selecting appropriate materials of the insulating layer 126 and the passivation layer 128, the leakage current of the high electron mobility transistors may be reduced, and the breakdown voltage and the output power may be increased. According to an example of the present invention, the material of the insulating layer 126 may include aluminum oxide ($Al_2O_3$) and the material of the passivation layer 128 may include silicon oxide ($SiO_2$).

Figure 4:
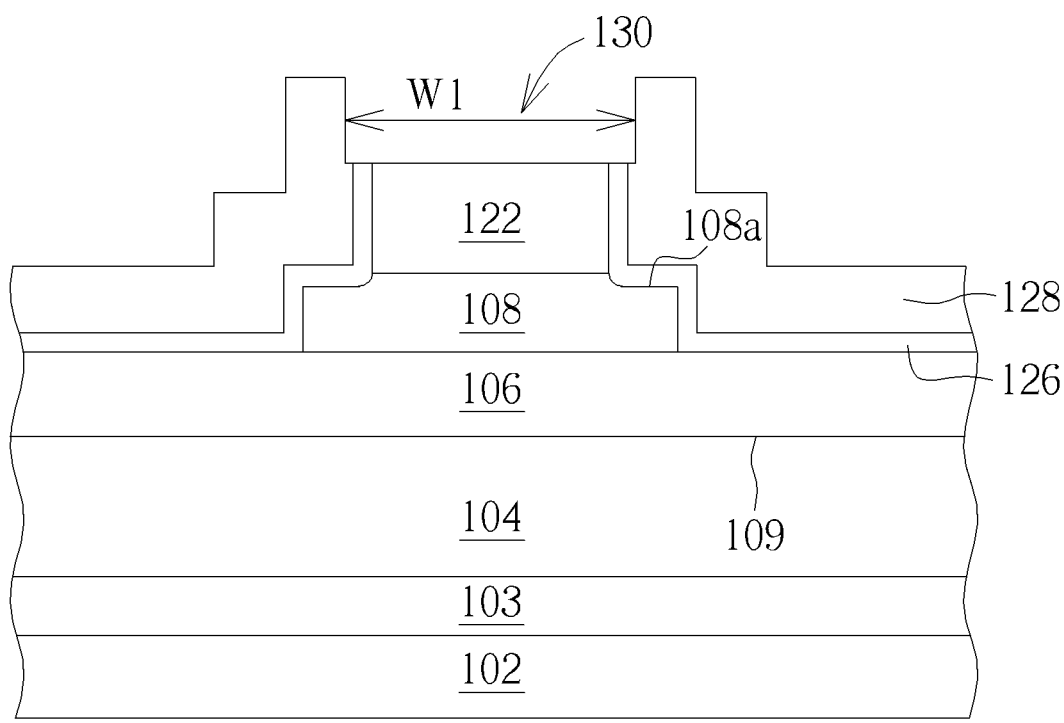

Please refer to FIG. 4. Subsequently, a patterning process (such as a photolithography-etching) may be performed to form an opening 130 through the insulating layer 126 and the passivation layer 128 directly above the metal gate layer 122 to expose a surface of the metal gate layer 122. In some embodiments, as shown in FIG. 4, the opening 130 may have a width W1 slightly larger than the width of the metal gate layer 122. In other embodiments, the width W1 of the opening 130 may be approximately equal to or slightly smaller than the width of the metal gate layer 122. It is noteworthy that, the insulating layer 126 and passivation layer 128 at two sides of the metal gate layer 122 as shown in FIG. 4 may serve as an etching buffer layer in the etching process for forming the opening 130. This may advantageously reduce the risk of the semiconductor gate layer 108 being damaged by the etching process when the width W1 of the opening 130 is made larger than the width of the metal gate layer 122 or when a misalignment between the opening 130 and the metal gate layer 122 happens.

Figure 5:
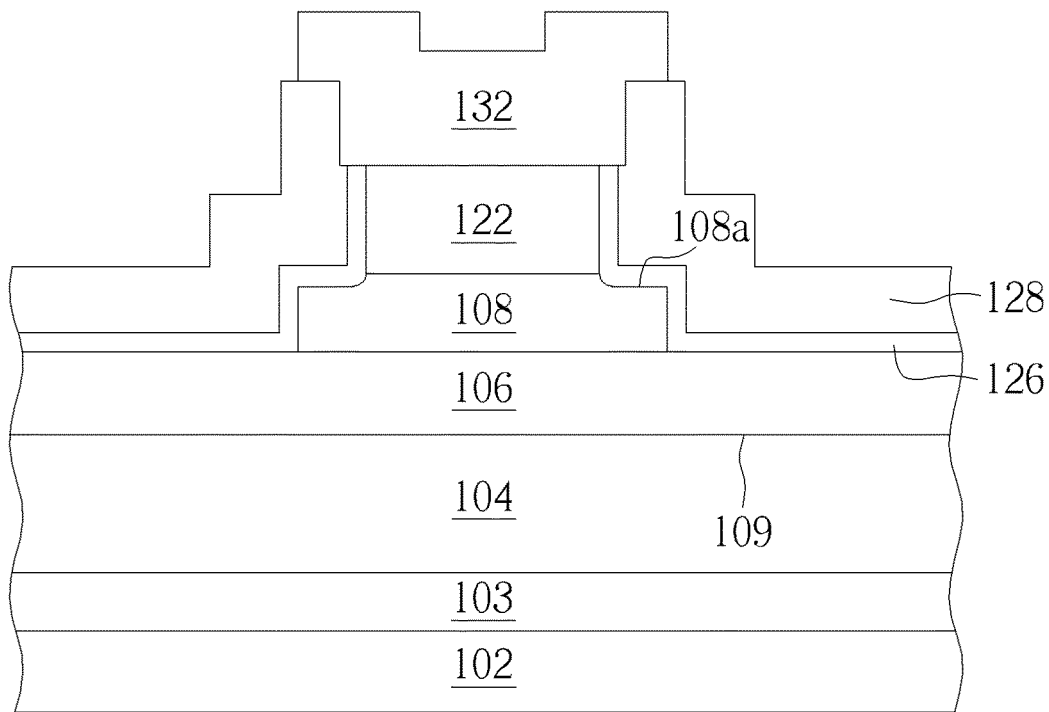

Please refer to FIG. 5. Following, a gate electrode 132 is formed on the passivation layer 128, filling the opening 130 and in direct contact with the metal gate layer 122. The material of the gate electrode 132 may include metal. such as gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. According to an embodiment of the present invention, the material of the gate electrode 132 may include aluminum (Al), copper (Cu), or an aluminum-copper alloy.

Please continue to refer to FIG. 5. The high electron mobility transistor according to the first embodiment of the present invention includes a substrate 102, a buffer layer 103 disposed on the substrate 102, a channel layer 104 disposed on the buffer layer 103, a barrier layer 106 disposed on the channel layer 104, a semiconductor layer 108 disposed on the barrier layer 106, a metal gate layer 122 disposed on the semiconductor layer 108, and a gate electrode 132 disposed on the metal gate layer 122 and in direct contact with the metal gate layer 122. A portion of the semiconductor gate layer 108 at two sides of the metal gate layer 122 includes a recessed top surface 108a. The high electron mobility transistor further includes an insulating layer 126 and a passivation layer 128 covering a surface of the barrier layer 106, a sidewall and the recessed top surface 108a of the semiconductor gate layer 108, a sidewall of the metal gate layer 122, and a sidewall of the gate electrode 132. During operation, a gate bias voltage is applied to the semiconductor gate layer 108 through the gate electrode 132 and the metal gate layer 122. Because the sidewall of the metal gate layer 122 is retracted away from the sidewall of the semiconductor gate layer 108, the strength of the electric field near the sidewall of the semiconductor gate layer 108 may be reduced. Accordingly, the gate leakage caused by the parasitic transistor on the sidewall of the semiconductor gate layer 108 may be reduced.

Figure 6:
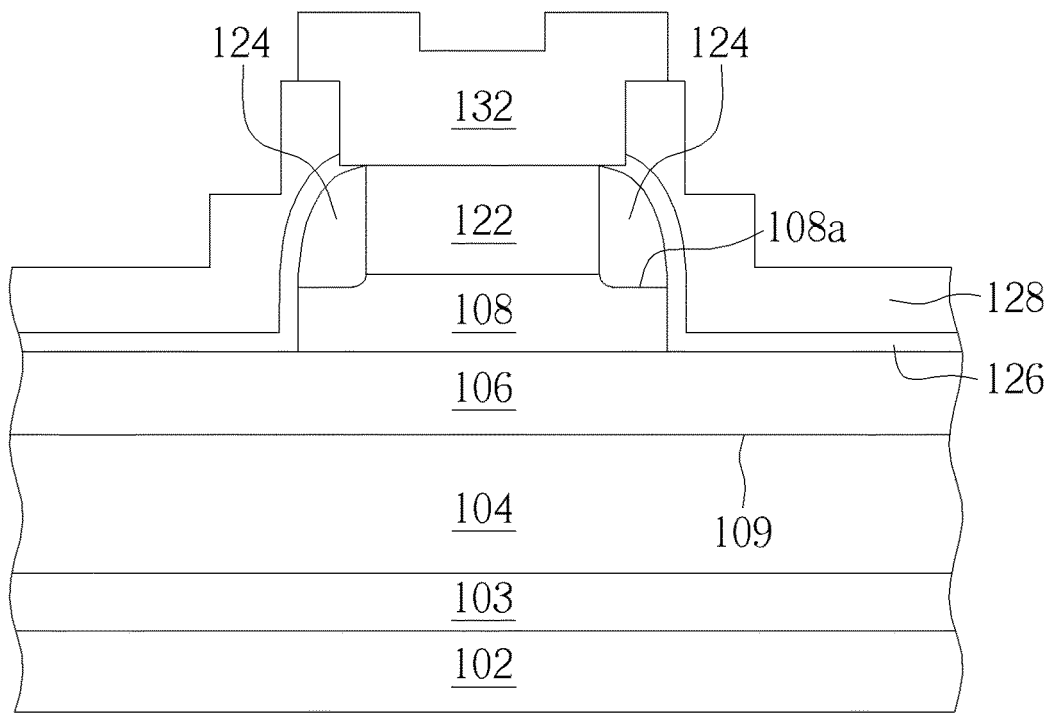
FIG. 6 shows a modification of the high electron mobility transistor shown in FIG. 5.
Figure 7:
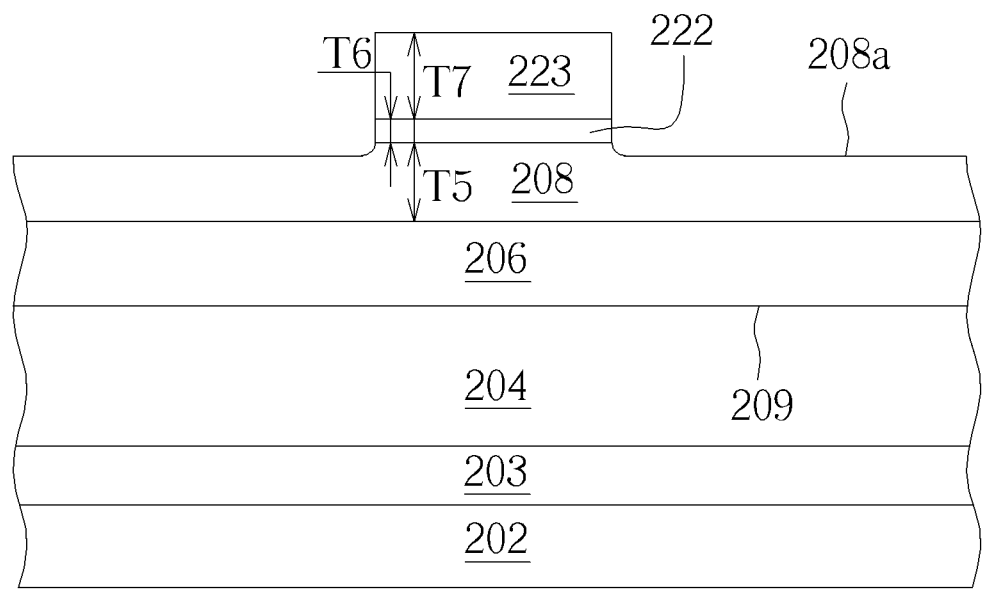
FIG. 7 to FIG. 12 are schematic cross-sectional views of a high electron mobility transistor at different steps of a manufacturing process according to a second embodiment of the present invention.

Please refer to FIG. 6, which shows a modification of the high electron mobility transistor shown in FIG. 5. To simplify the description and facilitate the understanding and comparison, identical components in FIG. 5 and FIG. 6 are marked with identical symbols. Instead of removing the spacers 124 after etching the semiconductor gate layer 108, the high electron mobility transistor shown in FIG. 6 keeps the spacers 124 on the sidewalls of the metal gate layer 122 and the recessed top surfaces 108a of the semiconductor gate layer 108. The insulating layer 126 and the passivation layer 128 are then formed on the barrier layer 106, the semiconductor gate layer 108, the spacers 124, and the metal gate layer 122. When the material of the spacers 124 is different from the materials of the insulating layer 126 and the passivation layer 128, the spacers 124 may have an etching selectivity different from the insulating layer 126 and the passivation layer 128, and therefore may serve as an etch mask in the etching process for forming the opening 130 (referring to FIG. 4) to provide additional protection to the semiconductor gate layer 108.

FIG. 7 to FIG. 12 are schematic cross-sectional views of a high electron mobility transistor at different steps of a manufacturing process according to a second embodiment of the present invention. Please refer to FIG. 7, a substrate 202 is provided, and an epitaxial stacked layer is formed on the substrate 202. The epitaxial stacked layer may include, form the bottom (near the substrate 202) to the top (away from the substrate 202), a buffer layer 203, a channel layer 204, a barrier layer 206, and a semiconductor gate layer 208. Subsequently, a metal gate layer 222 and a dummy gate 223 are formed on the semiconductor gate layer 208. The materials of the substrate 202, the buffer layer 203, the channel layer 204, the barrier layer 206, the semiconductor gate layer 208, and the metal gate layer 222 may be referred to the previous descriptions is not repeated herein. A two-dimensional electron gas layer (not shown) may be formed near the junction 209 between the barrier layer 206 and the channel layer 204, which may serve as a planar-type current channel when the high electron mobility transistor is at on-state. It should be noted that the material of the dummy gate 223 has to be different from the materials of the insulating layer 226 and the passivation layer 228 (shown in FIG. 9) formed in later process. According to an embodiment of the present invention, the material of the dummy gate 223 may include polysilicon.

The metal gate layer 222 and the dummy gate 223 may be formed by, for example, forming a conductive layer (not shown) and a polysilicon layer (not shown) on the semiconductor gate layer 208, and then performing a patterning process (such as a photolithography-etching) to pattern the conductive layer and the polysilicon layer, thereby obtaining the metal gate layer 222 and the dummy gate 223 at the same time. It is noteworthy that, during the patterning process of the conductive layer and the polysilicon layer, portions of the semiconductor gate layer 208 may be exposed to the etching process and loses some thickness. Therefore, the portions of the semiconductor gate layer 208 exposed from the metal gate layer 222 may respectively have a recessed top surface 208a that are slightly lower than a bottom surface of the metal gate layer 222. In other words, the top surface of the semiconductor gate layer 208 covered by the metal gate layer 222 and the top surfaces of the semiconductor gate layer 208 exposed from the metal gate layer 222 are not co-planar.

Furthermore, to provide a sidewall with a height sufficient for performing the self-aligned spacer process to form the spacers 224 (shown in FIG. 8), a sum of the thickness T6 of the metal gate layer 222 and the thickness T7 of the dummy gate 223 is preferably approximately 1 to 1.5 times of the thickness T5 of the semiconductor gate layer 208. Furthermore, to provide a smaller gate resistance, the thickness T6 is preferably smaller than the thickness T7. According to an embodiment of the present invention, the thickness T5 of the semiconductor gate layer 208 may be between 70 nm and 90 nm, the thickness T6 of the metal gate layer 222 may be between 25 nm and 35 nm, and the thickness T7 of the dummy gate 223 may be between 90 nm and 110 nm, but are not limited thereto.

Figure 8:
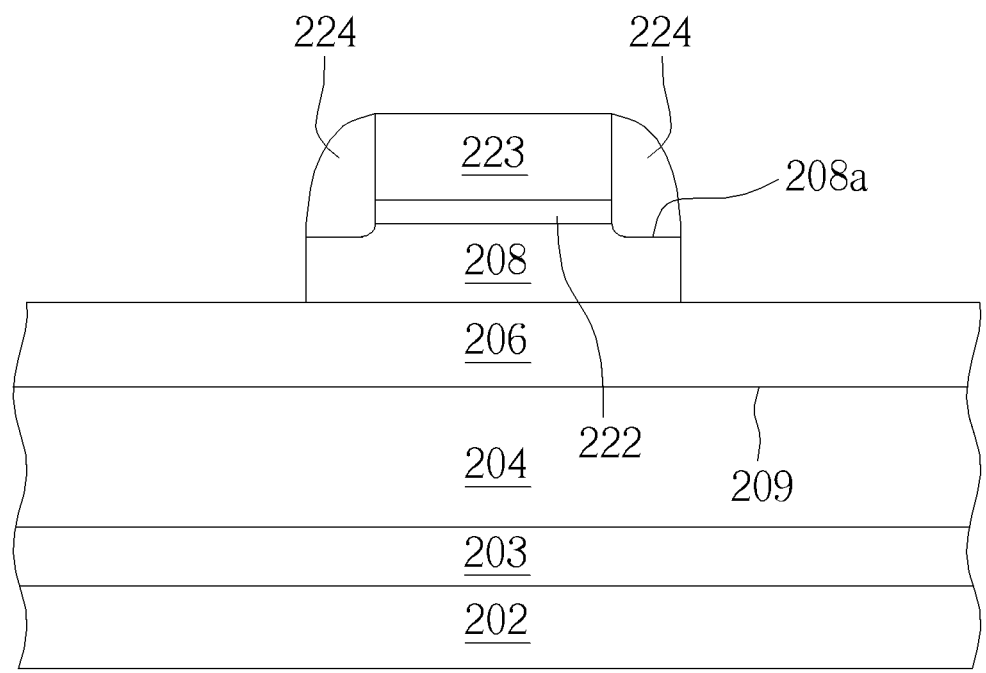

Please refer to FIG. 8. Following, spacers 224 are formed on the sidewalls of the metal gate layer 222 and the sidewalls of the dummy gate 223. An etching process is then performed, using the dummy gate 223 and the spacers 224 as a mask to etch and pattern the semiconductor gate layer 208 until the barrier layer 206 is exposed from the patterned semiconductor gate layer 208.

Figure 9:
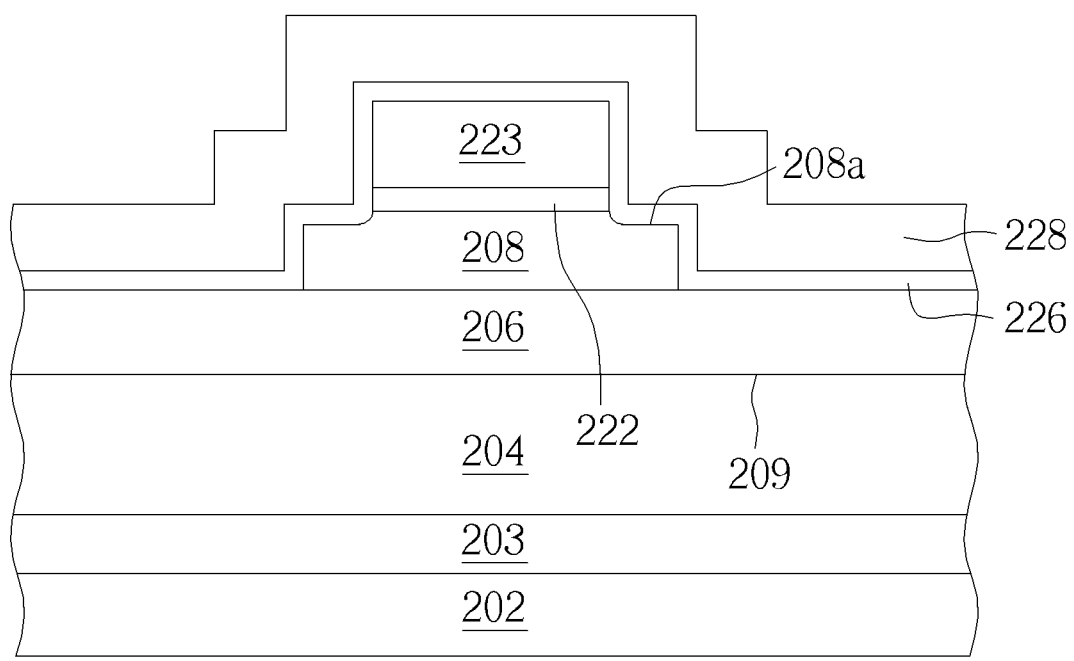

Please refer to FIG. 9. Subsequently, the spacers 224 are removed, and an insulating 226 and a passivation layer 228 are formed in a blanket manner to cover the barrier layer 206, the semiconductor gate layer 108, the metal gate layer 222, and the dummy gate 223. The materials of the insulating 226 and the passivation layer 228 may be referred to the previous descriptions is not repeated herein.

Figure 10:
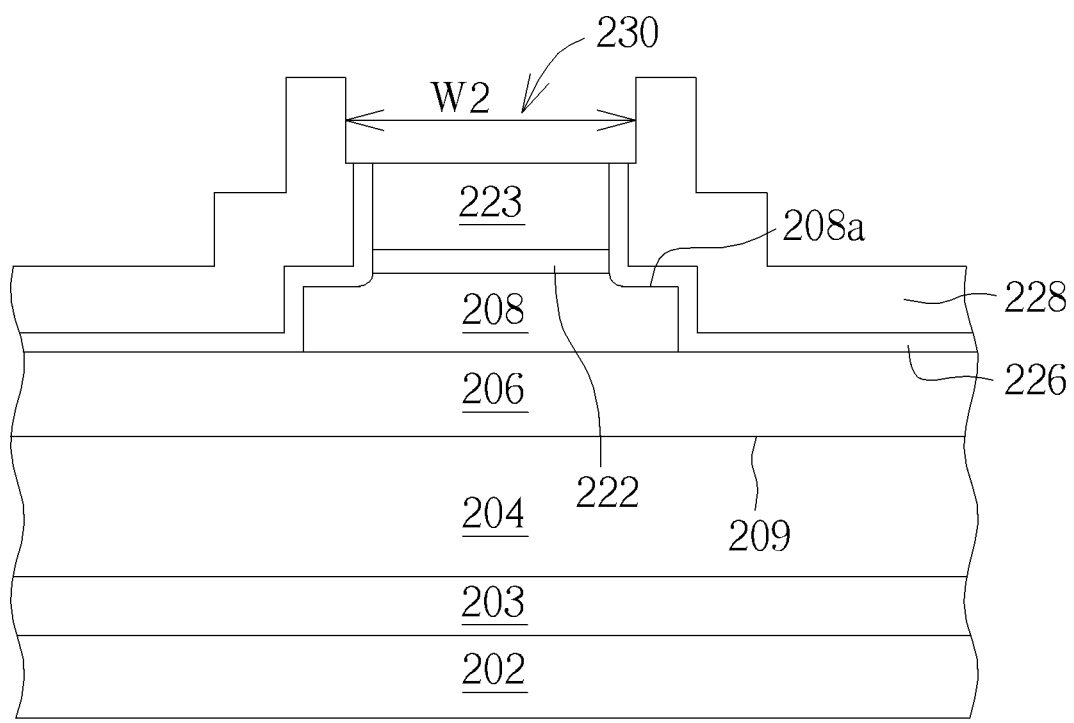

Please refer to FIG. 10. Subsequently, a patterning process (such as a photolithography-etching) may be performed to form an opening 230 through the insulating 226 and the passivation layer 228 directly above the dummy gate 223 to expose a surface of the dummy gate 223. In some embodiments, as shown in FIG. 10, the opening 230 may have a width W2 slightly larger than the width of the dummy gate 223. In other embodiments, the width W2 of the opening 230 may be approximately equal to or slightly smaller than the width of the dummy gate 223.

Figure 11:
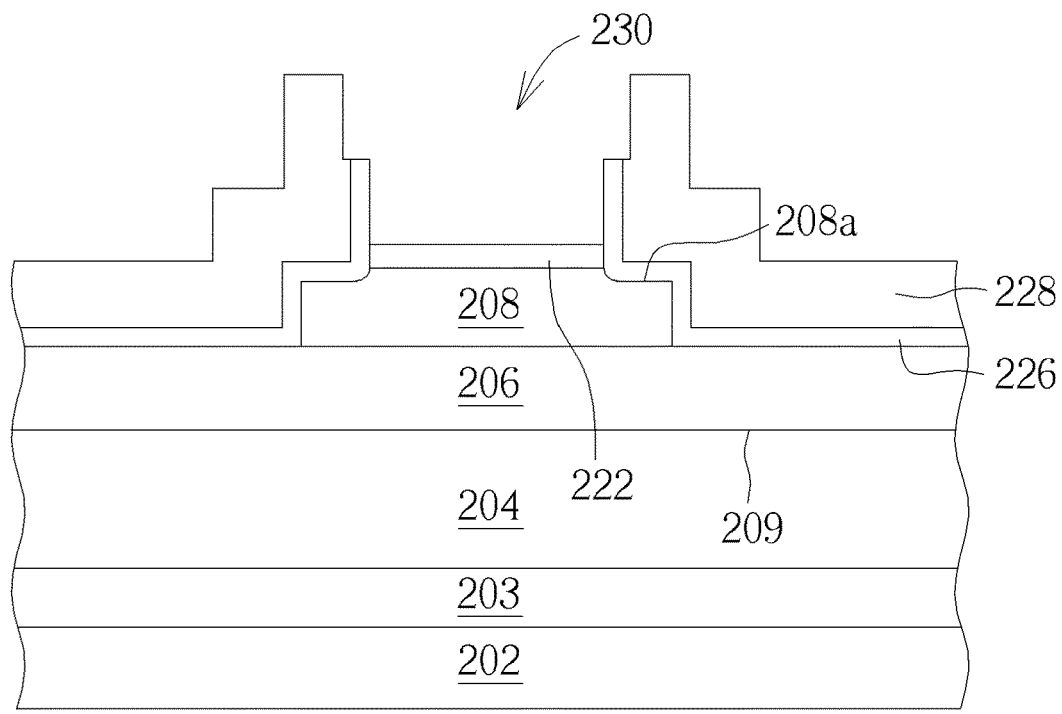

Please refer to FIG. 11. An etching process such as a wet etching process may be performed to remove the dummy gate 223 from the opening 230 until a surface of the metal gate layer 222 is exposed.

Figure 12:
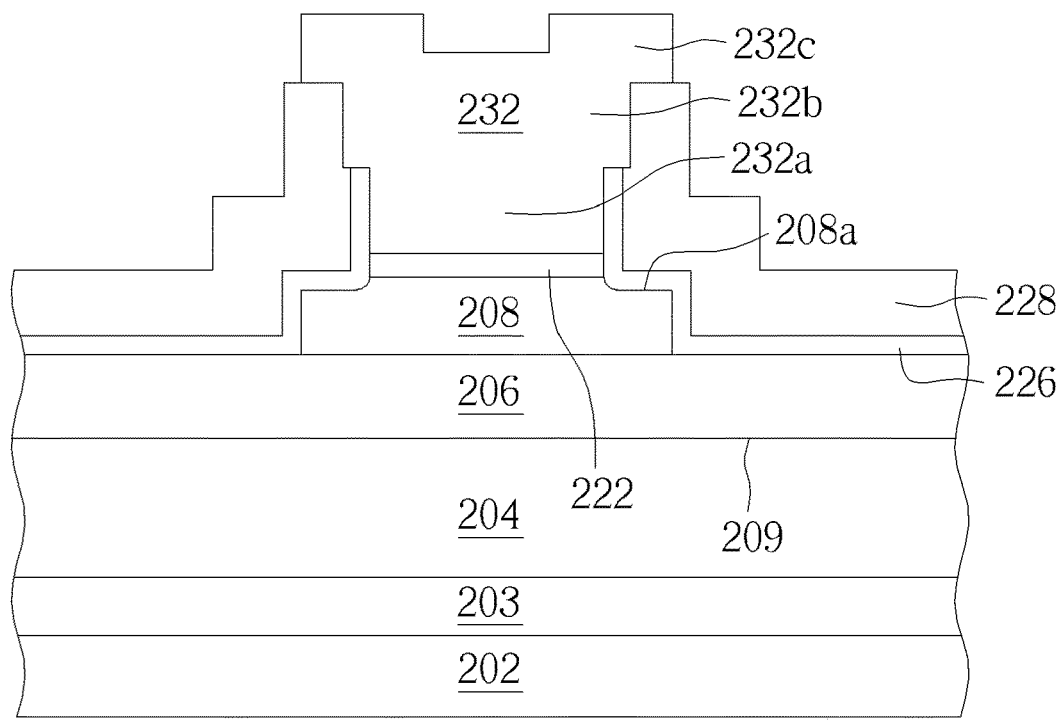

Please refer to FIG. 12. Following, a gate electrode 232 is formed on the passivation layer 228, filling the opening 230 and in direct contact with the metal gate layer 222. The material of the gate electrode 232 may be referred to the previous descriptions is not repeated herein.

Please continue to refer to FIG. 12. The high electron mobility transistor according to the second embodiment of the present invention includes a substrate 202, a buffer layer 203 disposed on the substrate 202, a channel layer 204 disposed on the buffer layer 203, a barrier layer 206 disposed on the channel layer 204, a semiconductor layer 208 disposed on the barrier layer 206, a metal gate layer 222 disposed on the semiconductor layer 208, and a gate electrode 232 disposed on the metal gate layer 222 and in direct contact with the metal gate layer 222. A portion of the semiconductor gate layer 208 at two sides of the metal gate layer 222 includes a recessed top surface 208a. The high electron mobility transistor further includes an insulating layer 226 and a passivation layer 228 covering a surface of the barrier layer 206, a sidewall and the recessed top surface 208a of the semiconductor gate layer 108, a sidewall of the metal gate layer 222, and a sidewall of the gate electrode 232. It is noteworthy that, as shown in FIG. 12, the gate electrode 232 may include a first portion 232a that is in direct contact with the metal gate layer 222 and is separated from the passivation layer 228 by the insulating layer 226, a second portion 232b that is above the first portion 232a and is in direct contact with the passivation layer 228, and a third portion 232c that is above the second portion 232b and extends laterally to partially cover an upper surface of the passivation layer 228. A sidewall of the first portion 232a and the sidewall of the metal gate layer 222 are aligned along a vertical direction.

Figure 13:
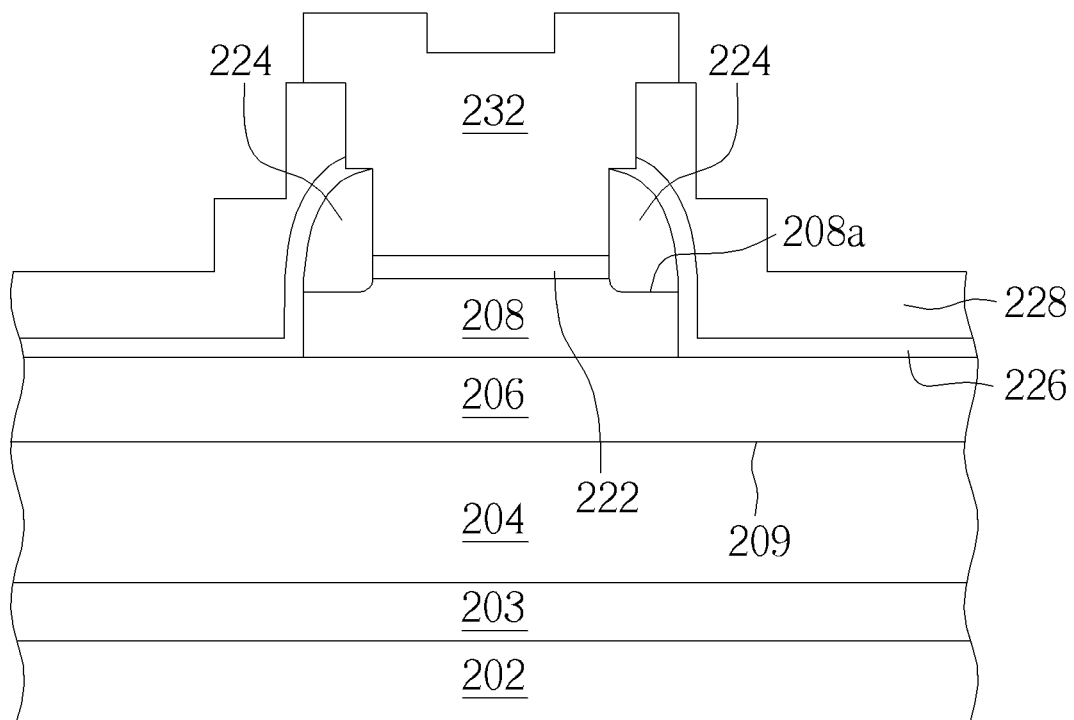
FIG. 13 shows a modification of the high electron mobility transistor shown in FIG. 12.

FIG. 13 shows a modification of the high electron mobility transistor shown in FIG. 12. To simplify the description and facilitate the understanding and comparison, identical components in FIG. 12 and FIG. 13 are marked with identical symbols. Instead of removing the spacers 224 after etching the semiconductor gate layer 208, the high electron mobility transistor shown in FIG. 13 keeps the spacers 224 on the sidewalls of the metal gate layer 222, the sidewalls of the dummy gate 223, and the recessed top surfaces 208a of the semiconductor gate layer 208. The insulating layer 226 and the passivation layer 228 are then formed on the barrier layer 206, the semiconductor gate layer 208, the spacers 224, and the dummy gate 223. As shown in FIG. 13, the insulating layer 226 and the metal gate layer 224 are not in direct contact with each other by being separated by the spacers 224.

In conclusion, the high electron mobility transistor (HEMT) and method for forming the same provided by the present invention includes a metal gate layer formed between the semiconductor gate layer and the gate electrode wherein the sidewall of the metal gate layer is retracted away from the sidewall of the semiconductor gate layer. In this way, when the high electron mobility transistor is in operation, the strength of the electric field near the sidewall of the semiconductor gate layer may be reduced, so that the gate leakage caused by the parasitic transistor on the sidewall of the semiconductor gate layer may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a high electron mobility transistor, comprising:
    providing a substrate;
    forming a buffer layer on the substrate, a channel layer on the buffer layer, a barrier layer on the channel layer, and a semiconductor gate layer on the barrier layer;
    forming a metal gate layer on the semiconductor gate layer;
    forming a spacer on a sidewall of the metal gate layer;
    using the metal gate layer and the spacer as a mask to etch the semiconductor gate layer;
    forming an insulating layer having a single layer structure and directly covering a top surface of the barrier layer, a sidewall of the semiconductor gate layer, and a top surface of the metal gate layer;
    forming a passivation layer on the insulating layer;
    forming an opening extending continuously through the passivation layer and the insulating layer, wherein a width of the opening is larger than a width of the metal gate layer, and the top surface of the metal gate layer and a top surface of the insulating layer are exposed from a bottom surface of the opening; and
    forming a gate electrode on the passivation layer, filling the opening, and in direct contact with the metal gate layer and the insulating layer, wherein the gate electrode has a single layer structure.

2. The method for forming a high electron mobility transistor according to claim 1, further comprising:
    removing the spacer before forming the passivation layer.

3. The method for forming a high electron mobility transistor according to claim 1, wherein the spacer comprises silicon nitride (SiN).

4. The method for forming a high electron mobility transistor according to claim 1, wherein the metal gate layer comprises titanium nitride (TiN), the gate electrode comprises aluminum (Al), copper (Cu), or an aluminum-copper alloy.

5. The method for forming a high electron mobility transistor according to claim 1, wherein the buffer layer, the channel layer, the barrier layer, and the semiconductor gate layer respectively comprise a group III-V compound semiconductor.

6. The method for forming a high electron mobility transistor according to claim 5, wherein the buffer layer comprises aluminum gallium nitride (AlGaN), the channel layer, comprises gallium nitride (GaN), the barrier layer comprises aluminum gallium nitride (AlGaN), and the semiconductor gate layer comprises p-type gallium nitride (p-GaN).

7. The method for forming a high electron mobility transistor according to claim 1, wherein a thickness of the metal gate layer is approximately 1 to 1.5 times a thickness of the semiconductor gate layer.

* * * * *